United States Patent
Li et al.

(10) Patent No.: US 10,600,307 B2
(45) Date of Patent: Mar. 24, 2020

(54) ENERGY CONSUMPTION ALERTING METHOD, ENERGY CONSUMPTION ALERTING SYSTEM AND PLATFORM

(71) Applicant: Global Design Corporation Ltd., Wanchai (HK)

(72) Inventors: Yee Shing Li, Hong Kong (HK); Yung Fai Ho, Hong Kong (HK)

(73) Assignee: GLOBAL DESIGN CORPORATION LTD., Wanchai (HK)

( * ) Notice: Subject to any disclaimer, the term of this patent is extended or adjusted under 35 U.S.C. 154(b) by 276 days.

(21) Appl. No.: 14/929,008

(22) Filed: Oct. 30, 2015

(65) Prior Publication Data

US 2017/0124846 A1    May 4, 2017

(51) Int. Cl.
*G08B 21/18* (2006.01)
*G01R 21/133* (2006.01)
(Continued)

(52) U.S. Cl.
CPC ......... *G08B 21/182* (2013.01); *G01R 21/133* (2013.01); *G06Q 50/06* (2013.01); *H04M 1/72561* (2013.01)

(58) Field of Classification Search
CPC ............................ G08B 21/182; G01R 21/133
(Continued)

(56) References Cited

U.S. PATENT DOCUMENTS 7,974,913 B1    7/2011  Morozov et al.
9,800,646 B1   10/2017  Stamatakis et al.
(Continued)

FOREIGN PATENT DOCUMENTS

CN    102354178 A    2/2012
CN    102969796 A    3/2013
(Continued)

OTHER PUBLICATIONS

Cleveland, R. B., et al., "STL: A Seasonal-Trend Decomposition Procedure Based on Loess," Journal of Official Statistics, vol. 6, No. 1, Mar. 1990, pp. 1-33.
(Continued)

*Primary Examiner* — Ricky Ngon
(74) *Attorney, Agent, or Firm* — Slater Matsil, LLP

(57) ABSTRACT

An energy consumption alerting method includes measuring location-specific energy consumption values over a specific period at a sensor deployed at a location of a monitored site, and decomposing the location-specific energy consumption values according to a first characteristic. The method further includes decomposing the location-specific energy consumption values according to a second characteristic, and obtaining a first decomposed energy consumption value. The method additionally includes determining a corresponding first reference value based on the decomposed values, and comparing the first decomposed energy consumption value with the determined corresponding first reference value. Additionally, the method includes notifying a user if the first decomposed energy consumption value and the determined corresponding first reference value differ from each other. Furthermore, an energy consumption alerting system and a cloud-based energy consumption alerting platform is provided.

17 Claims, 2 Drawing Sheets

(51) Int. Cl.
*G06Q 50/06* (2012.01)
*H04M 1/725* (2006.01)

(58) Field of Classification Search
USPC .......................................................... 702/62
See application file for complete search history.

(56) References Cited

U.S. PATENT DOCUMENTS

| | | | |
|---|---|---|---|
| 2003/0101009 A1* | 5/2003 | Seem | H02J 3/00 |
| | | | 702/61 |
| 2004/0102937 A1 | 5/2004 | Ibrahim | |
| 2005/0090995 A1 | 4/2005 | Sonderegger | |
| 2005/0171645 A1 | 8/2005 | Oswald et al. | |
| 2008/0109387 A1 | 5/2008 | Deaver et al. | |
| 2009/0157573 A1 | 6/2009 | Anderson et al. | |
| 2010/0030617 A1 | 2/2010 | Handley | |
| 2010/0274602 A1* | 10/2010 | Kaufman | G06Q 10/04 |
| | | | 705/7.38 |
| 2011/0040785 A1* | 2/2011 | Steenberg | G05B 23/0235 |
| | | | 707/769 |
| 2012/0143383 A1 | 6/2012 | Cooperrider et al. | |
| 2012/0158631 A1 | 6/2012 | Pitcher et al. | |
| 2012/0259583 A1* | 10/2012 | Noboa | G05B 15/02 |
| | | | 702/179 |
| 2012/0316693 A1 | 12/2012 | Ogawa et al. | |
| 2013/0066479 A1* | 3/2013 | Shetty | G01D 4/002 |
| | | | 700/295 |
| 2013/0262197 A1 | 10/2013 | Kaulgud et al. | |
| 2014/0058572 A1* | 2/2014 | Stein | G06Q 50/06 |
| | | | 700/291 |
| 2014/0062707 A1* | 3/2014 | Hong | H04Q 9/00 |
| | | | 340/657 |
| 2014/0074311 A1 | 3/2014 | Kearns et al. | |
| 2014/0200763 A1 | 7/2014 | Sisk | |
| 2014/0222394 A1* | 8/2014 | Drees | G06F 17/5009 |
| | | | 703/2 |
| 2015/0100167 A1 | 4/2015 | Sloo et al. | |
| 2015/0178633 A1* | 6/2015 | ElBsat | G06F 17/16 |
| | | | 706/14 |
| 2015/0178865 A1 | 6/2015 | Anderson et al. | |
| 2015/0256401 A1 | 9/2015 | Zinger et al. | |
| 2015/0261963 A1* | 9/2015 | Ukil | H04L 63/04 |
| | | | 726/26 |
| 2016/0055419 A1 | 2/2016 | Fischer et al. | |
| 2016/0187449 A1 | 6/2016 | Beiner et al. | |
| 2016/0370830 A1 | 12/2016 | Miller | |
| 2017/0090004 A1 | 3/2017 | Marshall et al. | |

FOREIGN PATENT DOCUMENTS

| | | |
|---|---|---|
| CN | 103018582 A | 4/2013 |
| CN | 103236102 A | 8/2013 |
| CN | 103543309 A | 1/2014 |
| CN | 103676819 A | 3/2014 |
| CN | 104239982 A | 12/2014 |
| CN | 104615119 A | 5/2015 |
| KR | 20100125809 A | 12/2010 |
| KR | 101321622 B1 | 10/2013 |
| KR | 101336571 B1 | 12/2013 |

OTHER PUBLICATIONS

Grubbs, F. E., "Procedures for Detecting Outlying Observations in Samples," Technometrics, vol. 11, No. 1, Feb. 1969, pp. 1-22.

Hoerl, A. E., et al., "Ridge Regression: Biased Estimation for Nonorthogonal Problems," Technometrics, vol. 12, No. 1, Feb. 1970, pp. 55-67.

Rosner, B., "Percentage Points for a Generalized ESD Many-Outlier Procedure," Technometrics, vol. 25, No. 2, May 1983, pp. 165-172.

* cited by examiner

ENERGY CONSUMPTION ALERTING METHOD, ENERGY CONSUMPTION ALERTING SYSTEM AND PLATFORM

TECHNICAL FIELD

The present invention relates to energy consumption measurement systems. In particular, the present invention relates to an energy consumption alerting method, energy consumption alerting system and platform.

BACKGROUND

In conventional energy distribution networks, the energy consumption of a site is typically measured at a central supply point, e.g. an electricity meter installed between a supply line of an utility provider and a first distribution panel of a given site, for example a single building or a distinct part of a building such as an apartment or the like. In this way, all electrical energy consumed at that particular site can be measured, irrespective of the electrical distribution system of the given site.

The energy consumption measured at such a central supply point is usually used by the utility provider for billing purposes. Thus, at the end of a billing period such as a month or year, the utility provider usually prepares a utility bill based on the measured total consumption and provides it to the site manager or owner. Based on the provided utility bill, a site manager or owner can then determine whether he or she has stayed within a desirable energy budget or has exceeded it.

Such a conventional approach is sufficient for billing purposes. However, in times of high energy prices and a focus on energy efficiency, the data available in such a conventional scheme is insufficient in order to maintain a control over how the energy is actually consumed within a given site and also in order to estimate, at any given time, whether given energy targets will be met.

In addition to metering devices installed at a central supply point, individual metering devices are known. For example, an individual metering device may be plugged into a socket and supply energy to an individual electricity consumer, such as an electrical appliance. Such energy metering devices allow to measure the energy consumption of a particular appliance at a given location. However, such data is only available locally at the individual metering device. Thus, at least in sites comprising a relatively large number of electrical appliances and other electricity consumers, the use of such metering devices is both expensive and time consuming, if a building manager or owner wants to obtain a reasonably complete picture of the energy consumption of the site to be monitored.

Accordingly, there is a need for better systems and methods for monitoring the energy consumption at a particular site.

In particular, there is a need for systems and methods for monitoring the energy consumption at a particular site that reliably notify a user about unusual energy consumption.

SUMMARY

According to one embodiment of the present invention, an energy consumption alerting method is provided. The method comprises measuring location-specific energy consumption values over a specific period at a sensor deployed at a location of a monitored site, and decomposing the location-specific energy consumption values according to a first characteristic. The method further includes decomposing the location-specific energy consumption values according to a second characteristic, and obtaining a first decomposed energy consumption value. A corresponding first reference value based on the decomposed values is determined. The first decomposed energy consumption value is compared with the determined corresponding first reference value. A user is notified if the first decomposed energy consumption value and the determined corresponding first reference value differ from each other.

According to a further embodiment of the present invention, an energy consumption alerting system is described. The energy consumption alerting system comprises a sensor deployed at a location of a monitored site. The sensor is configured to provide location-specific energy consumption values over a specific period. The system comprises a data decomposition device comprising a processor and memory storing instructions to execute in the processor, the instructions configured to decompose the location-specific energy consumption values according to a first characteristic and according to a second characteristic. The system comprises an alerting device comprising a processor and memory storing instructions to execute in the processor, the instructions configured to compare a first energy consumption value of the location-specific energy consumption values with the corresponding first reference value and to notify a user, if the first energy consumption value and the determined corresponding first reference value defer from each other.

According to a further embodiment of the present invention, a cloud-based energy consumption alerting platform is disclosed. The cloud-based energy consumption alerting platform comprises a data decomposition device comprising a processor and memory storing instructions to execute in the processor, the instructions configured to decompose location-specific energy consumption values according to a first characteristic and according to a second characteristic. The location-specific energy consumption values are associated with a location of a monitored site and provided to the cloud-based energy consumption alerting platform over at least one data network. The platform comprises an alerting device comprising a processor and memory storing instructions to execute in the processor, the instructions configured to compare a first energy consumption value of the location-specific energy consumption values with a corresponding first reference value and to notify a user, if the first energy consumption value and the determined corresponding first reference value differ from each other.

The described various embodiments of the invention enable the implementation of an energy consumption alerting system, which allows a reliable notification of a user about an unusual energy consumption. In this way, a malfunction of a unit may be detected fast and reliably.

BRIEF DESCRIPTION OF THE DRAWINGS

Various embodiments of the present invention will be described with reference to the attached drawings.

DETAILED DESCRIPTION OF ILLUSTRATIVE EMBODIMENTS

In various embodiments, the present invention relates to an energy consumption alerting method that can notify a user about unusual energy consumption. The embodiments of the present invention further relates to an energy consumption alerting system and a cloud-based energy consumption alerting platform, which can notify a user about an unusual energy consumption.

Figure 1:
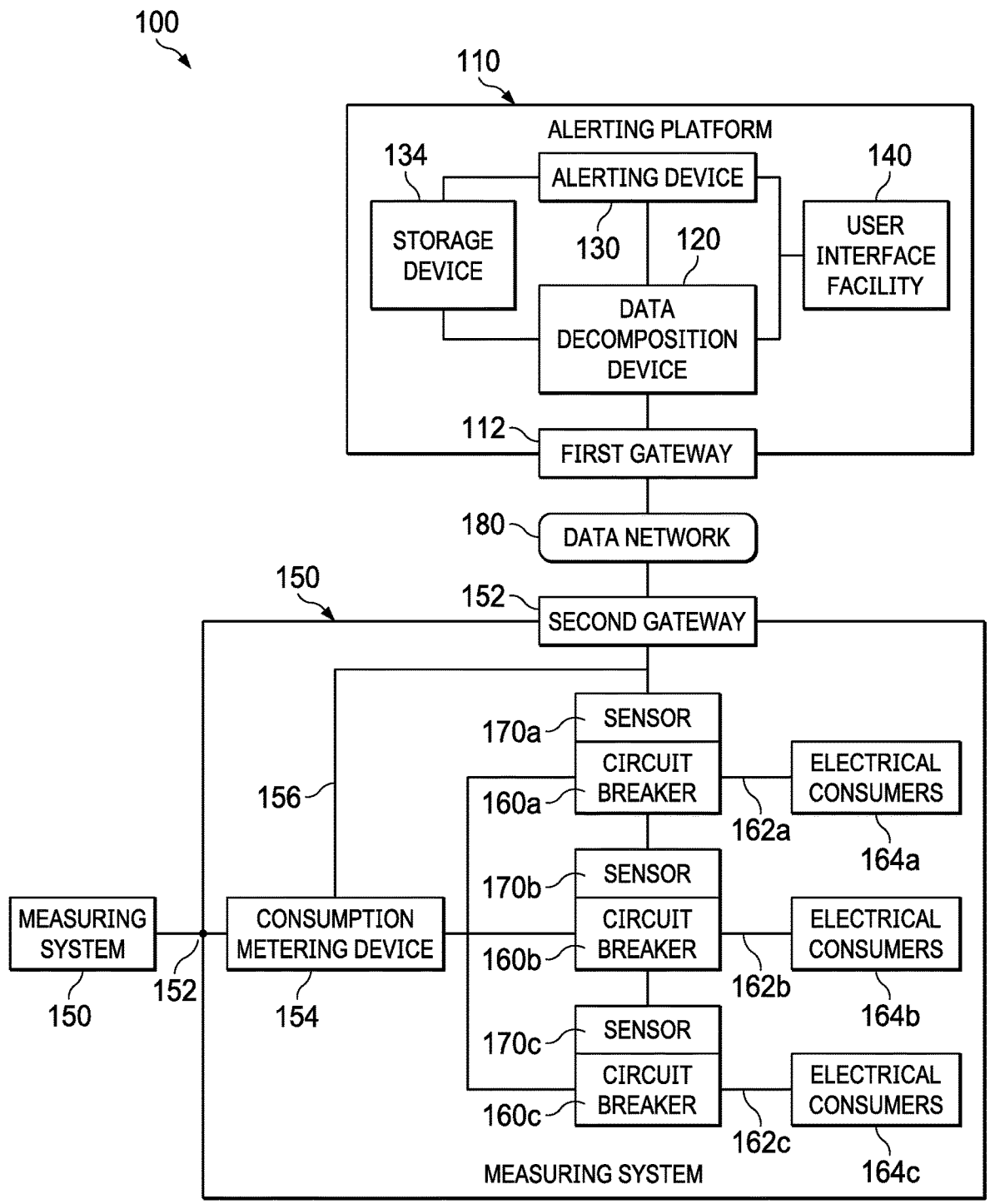
FIG. 1 shows a schematic diagram of an energy consumption alerting system in accordance with an embodiment of the invention.

FIG. 1 shows an energy consumption alerting system 100 according to an embodiment of the invention. The system 100 comprises an alerting platform 110 and a measuring system 150 connected thereto via a first gateway 112 and a second gateway 152 of a data network 180 such as the Internet.

The measuring system 150 is deployed at a site to be monitored, for example a single building or a group of buildings. In the depicted example, the site is supplied with electrical energy by a utility provider 190 at a central supply point 192. For example, the site may be connected to an energy distribution network of the utility provider 190 by a consumption metering device 154, e.g. a smart meter device. However, in an alternative embodiment, energy may be provided by multiple providers, multiple supply points and/ or by multiple energy carriers to the monitored site.

Within the monitored site, the energy supplied by the utility provider 190 is distributed by a number of distribution panels (not shown). Typically, the energy provided to any specific end-point within the site to be monitored is provided via at least one distribution panel and protected by at least one circuit-breaker. In the example embodiment shown in FIG. 1, only three circuit-breakers 160a to 160c are shown for reasons of simplicity. However, attention is drawn to the fact that the monitored site may contains tens, hundreds or even thousands of distribution panels and circuit-breakers.

In the described embodiment, each of the circuit-breakers 160a to 160c has a corresponding sensor 170a to 170c assigned to it. The sensors 170 are placed on the circuit-breakers 160 in order to monitor the energy consumption of corresponding circuits 162a to 162c leading to electrical consumers 164a to 164c, respectively. In a different embodiment, the sensors 170 may be associated with individual appliances, groups of circuit-breakers, distribution panels or any other distinct part of the energy distribution network within the site to be monitored. Such sensors and the data they collect are respectively referred to as granular level sensors and granular level energy consumption values in the following. The energy consumption values comprise consumption values for at least one of electrical energy, gas, oil, hot water and steam.

The sensors 170, and optionally the smart meter device 154, are connected by a local area network 156. In this way, location-specific energy consumption values for the individual consumers 164 collected at granular level can be gathered and provided via the gateway 152, the data network 180 and the gateway 112 to the alerting platform 110.

Attention is drawn to the fact that the present invention is not restricted to the specific measuring system 150 disclosed in FIG. 1. For the purpose of the present invention, it is sufficient to provide relatively fine-grained granular-level energy consumption values for further analysis as detailed below. Such data may also be obtained by advanced data analysis of data provided by one or a few sensors associated with larger parts of a monitored site, rather than by a large number of sensors associated with individual circuits or energy consuming devices.

The alerting platform 110 comprises a data decomposition device 120 as well as an alerting device 130.

The data decomposition device 120 decomposes energy consumption values 121 (FIG. 2), which are provided by the sensors 170. For example, the energy consumption values 121 are time series of historical consumption data. In particular, the data decomposition device 120 decomposes the energy consumption values 121 in two directions, in a vertical and a horizontal direction. Accordingly, the data decomposition device 120 decomposes the energy consumption values 121 according to a first characteristic and according to a second characteristic. According to further embodiments, two separate data decomposition devices are provided, a first data decomposition device configured to decompose the energy consumption values 121 into a plurality of different data sets according to the first characteristic and a second data decomposition device decompose the energy consumption values 121 into a plurality of different data sets according to the second characteristic.

The vertical decomposition is conducted to take seasonal effects into consideration, in particular daily seasonality or daily pattern. For example, the energy consumption of an air condition system is higher during the day than at night. In contrast, the energy consumption of a heating system may be higher at night than during the day.

According to an embodiment of the invention, the seasonal decomposition is conducted by the seasonal trend decomposition procedure based on Loess (e.g. described in the article "STL: A Seasonal-Trend Decomposition Procedure Based on Loess" by R. B. Cleveland, W. S. Cleveland, J. E. McRae, and I. Terpenning, which was published in the Journal of Official Statistics, volume 6, issue 1, pages 3 to 73, 1990) or the seasonal decomposition via moving average (e.g. described by F. E. Grubbs (1969). Procedures for detecting outlying observations in samples. Technometrics, volume 11, issue 1, pages 1 to 21. Of course, further decomposition methods that allow a seasonal decomposition of the energy consumption values may be used.

When the seasonal trend decomposition is used, the energy consumption values 121 are separated into three components: the seasonal component, the trend and the residual. For the comparison that is performed by the alerting device 130 and explained later on, only the residual component is used. Accordingly, seasonal effects and trend effects are excluded. Thus, changes in the energy consumption that are based on seasonal effects and changes that are based on an overall trend can be taken out.

The horizontal decomposition is used to separate the energy consumption values 121 according to different types of days. For example, the values are decomposed into the components weekday, weekend and holiday. Accordingly, differences between the energy consumption on the different types of day can be considered. For example, the energy consumption of an office may be higher on a weekday than on the weekend.

The alerting device 130 compares the decomposed values provided by the data decomposition device 120 with one or more corresponding reference values. For example, the alerting device 130 performs a generalized extreme studentized deviate test (GESD). For example, the GESD test is described by B. Rosner in the article "Percentage points for a generalized ESD many-outlier procedure", which was published in 1983 in Technometrics, volume 25, issue 2, pages 165 to 172.

The decomposed values of the residual component are studentized, for example as follows, given a dataset x={x_1, . . . x_N}:

$$G_j = \max_i \frac{|x_i - \bar{x}|}{s}$$

A studentized value or a multitude of studentized values is compared with the reference value. For example, a decomposed and studentized current energy consumption value is compared with the reference value, which is based on historic energy consumption data. x_N may be the most current value.

For example, the reference value is computed with the following formula:

$$\lambda_j = \frac{(N-j)t_{p,N-j-1}}{\sqrt{(N-j-1+t_{p,N-j-1}^2)(N-j+1)}}$$

With:

$$p = 1 - \frac{\alpha}{2(N-j+1)}$$

And t_{h,k} indicates the h percent point function of the t-distribution with k degree of freedom.

$\alpha \in (0,1)$ is the significance level of the detection.

When the studentized value is greater than the reference value, $G_j > \lambda_j$ the studentized value is considered as an outlier that is based on an unusual energy consumption of a corresponding electrical consumer.

The alerting platform 110 comprises a user interface facility 140. The user interface facility 140 is used for outputting a message, for example an alerting message. For example, the message is displayed within the alerting platform 110 or may be provided to an external system, such as an e-mail account or a web interface for further processing. For example, the notification is visualized and displayed on the user interface facility 140 which is for example realized as a display of the alerting platform 110. According to further embodiments the user is notified via a user interface facility 140 which is part of a portable device such as a smartphone. For example, the notification may be send by means of automated messaging systems, such as e-mail or text messages.

Optionally, the alerting platform 110 may also comprise a storage device 134 for storing the location-specific energy consumption values provided by the sensors 170 and/or the decomposed values and for the reference values. In addition or alternatively, the storage facility 134 may also be used to store the alert messages. For example, the storage device 134 is a storage device of a cloud service.

According to the described embodiment, the alerting device 130 is implemented as a cloud-based web application. Alternatively or in addition, the data decomposition device 120 is implemented as a cloud-based web application.

The data decomposition device 120 and/or the alerting device 130 are connected with the measuring system 140 via the data network 180. The measuring system 150 is installed at a specific site that should be monitored and the alerting platform 110 can be implemented outside the specific site.

Figure 2:
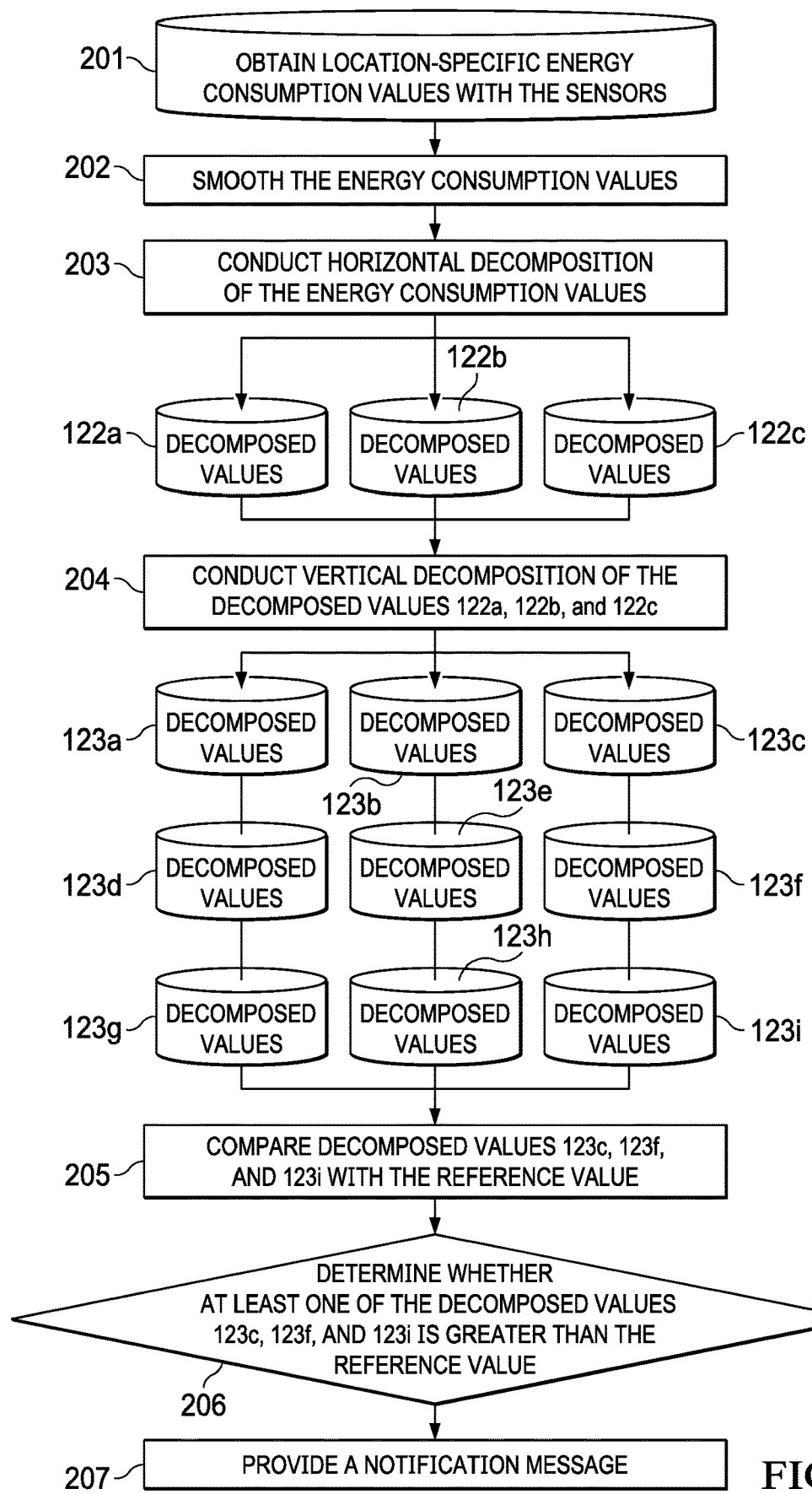
FIG. 2 shows a flow chart of an energy consumption alerting method in accordance with an embodiment of the invention.

FIG. 2 shows a flow chart of an exemplary method for operating the energy consumption alerting system 100 shown in FIG. 1.

According to the method, in a first step 201, location-specific energy consumption values 121 are obtained with the sensors 170. In particular, the consumption values are obtained for a specific period, for example 6 months. The period should be long enough to have enough information about seasonal effects. For example, the energy consumption values 121 obtained in step 201 are provided over one or several data networks to the alerting platform 110.

In an optional step 202, the energy consumption values 121 are smoothed, e.g. by a gaussian filter.

In a step 203, a horizontal decomposition of the energy consumption values 121 is conducted. With the horizontal decomposition, the series of energy consumption values 121 is separated according to the type of day into the decomposed values 122a, 122b and 122c. For example the type of day may be one of workday, weekend and holiday. According to further embodiments, there are more than three different types of decomposed values after the step 203 or less than three types of decomposed values.

In a further step 204, a vertical decomposition of the decomposed values 122a, 122b and 122c is conducted. In the vertical decomposition, the series of decomposed values 122 is separated into three components: the seasonal component, the trend component and the residual component. Accordingly, after step 204 there are decomposed values 123a to 123i. Due to the vertical decomposition, it is possible to eliminate seasonal effects and trend effects out of the decomposed values 122. Only the residual component, in particular the decomposed values 123c, 123f and 123i of the decomposed values 122 are further processed.

In a step 205, the decomposed values 123c, 123f and 123i are compared with the reference value. For example, the generalized extreme studentized deviate (ESD) test is performed for the decomposed values 123c, 123f and 123i.

In a further step 206, it is determined whether at least one of the decomposed values 123c, 123f and 123i is greater than the reference value. If a decomposed value is greater than the reference value, it is considered as an outlier and in step 207 a notification message is provided. For example, the generalized extreme studentized deviate (ESD) is used to detect outliers.

For example, given a dataset of size 100, with a significance level of 5%, in the first iteration, $$p = 1 - \frac{0.05}{2(100-1+1)} = 0.99975$$

and $t_{0.99975, 100-1+1} = 3.600812$ and $$\lambda_j = \frac{(100-1) \times 3.600812}{\sqrt{(100-1-1+3.600812^2)(100-1+1)}} = 3.353992$$

If condition $G_j > \lambda_j$ is satisfied, x_i is marked as outlier. For further processing, x_i may be removed from the series x.

With the updated series, the iteration is repeated, until $G_j > \lambda_j$ is not satisfied. Then, all outliers are detected.

With the described embodiment it is possible to monitor the energy consumption of the electric consumers 164 and to detect an unusual behavior of one of the electrical consumers 164. Facility equipment abnormal behavior will be detected. Further, preventive maintence is possible. For example, if there is a failure in one of the electrical consumers 164 that leads to an unusual energy consumption, the facility management of the monitored site can be notified. Additionally, the facility management can be notified when one of the electrical consumers 164 is turned off but should be running. Thus, even unpredictable incidents such as machine or equipment broke down can be monitored and the facility management can be notified quickly. Accordingly, the facility management can perform emergency support and troubleshooting immediately and bring the operation back to normal. The facility management is notified by the actual energy consumption of the specific electrical consumer 164. Hence, it is not necessary to rely on a reporting function of a system or a manual reporting from another user. This makes the duration time of the issue much shorter. With the energy consumption alerting system 100 it is possible to alert a facility management, if there is any abnormality of the equipment or machinery by analyzing its energy consumption pattern. For example, when the consumption is all in sudden much lower or tends to zero, it could be caused by a malfunction of the unit.

To detect, interpret and analyze the energy consumption pattern, the vertical and horizontal decomposition is used. Accordingly, long term behavior changes could be handled that are recognized in the trend component. For example, in the trend component it is captured that the energy consumption of an air condition system is higher in summer than in winter. In contrast, the energy consumption of a heating system may be higher in winter than in summer. Further, behavior changes that are caused by a holiday effect or by a weekend effect can be handled due to the horizontal decomposition. Furthermore, it is possible to take seasonality into consideration. False notifications will not be triggered due to the effect of seasonality and trend after the vertical decomposition. Swamping and masking issues are prevented according to the properties of the generalized extreme studentized deviate test.

The user gets a pre-alert at any abnormal behavior, which may potentially lead to complete equipment or machinery broke down or failure. That can prevent serious failures. The user will get immediate active alerts and notifications, once anything is failed based on the abnormality detection. The user can give immediate response for action to handle the issue. Due to the determination of the energy consumption values at a granular level, the user knows exactly where the problem is or which consumer 164 generates the unusual energy consumption. The energy consumption data at breaker level is used to detect the consumption pattern for each energy consumer 164 instead of taking overall consumption data of the monitored site. The described method, system and platform are accurate and directly point out which consumer 164 has an abnormal energy consumption.

What is claimed is:

1. An energy consumption alerting method, the method comprising:
   measuring location-specific energy consumption values over a specific period at a sensor deployed at a location of a monitored site;
   decomposing the location-specific energy consumption values according to a defined time period;
   decomposing the location-specific energy consumption values according to a second characteristic, wherein decomposing the values according to the second characteristic comprises:
      decomposing the values by conducting a seasonal decomposition into trend, seasonal and residual components to identify changes in the energy consumption that are based on seasonal effects and changes that are based on an overall trend;
   obtaining a first decomposed energy consumption value based on the defined time period and based on the residual component to identify changes in the energy consumption that are based on unintended energy consumption;
   determining a corresponding first reference value based on the decomposed values;
   comparing the first decomposed energy consumption value with the determined corresponding first reference value;
   outputting a message that notifies a user about the unintended energy consumption if the first decomposed energy consumption value and the determined corresponding first reference value differ from each other; and
   on receiving the message, having an emergency support mechanism to address the unintended energy consumption and bring energy consumption at the monitored site back to normal energy consumption levels.

2. The method according to claim 1, further comprising:
   studentizing at least one value of the residual;
   comparing the studentized value with the reference value; and
   notifying the user if the studentized value is greater than the determined first reference value.

3. The method according to claim 1, further comprising:
   determining the first reference value based on the values of the residual.

4. The method according to claim 1, wherein conducting the type of the decomposition based on the date, comprises:
   decomposing the values into components: weekday, holiday and weekend.

5. The method according to claim 1, the method further comprises:
   obtaining a series of energy consumption values out of the location-specific energy consumption values;
   comparing the series with the determined corresponding first reference value; and
   notifying a user if the series and the determined corresponding first reference value differ from each other.

6. An energy consumption alerting system comprising:
   a sensor deployed at a location of a monitored site, the sensor being configured to provide location-specific energy consumption values over a specific period;
   a decomposition device comprising a processor and memory storing instructions to execute in the processor, the instructions configured to decompose the location-specific energy consumption values according to a defined time period and according to a second characteristic, wherein the instructions configured to decompose according to the second characteristic comprise instructions configured to decompose the values by conducting a seasonal decomposition into trend, seasonal and residual components to identify changes in the energy consumption that are based on seasonal effects and changes that are based on an overall trend; and
   an alerting device comprising a processor and memory storing instructions to execute in the processor, the instructions configured to compare a first decomposed energy consumption value of the location-specific energy consumption values, wherein the first decomposed energy consumption value is based on the defined time period and based on the residual component to identify changes in the energy consumption that are based on unintended energy consumption, with a corresponding first reference value based on the decomposed values and to output a message that notifies a user about the unintended energy consumption, if the first decomposed energy consumption value and the determined corresponding first reference value differ from each other, wherein on receiving the message, the unintended energy consumption is configured to be addressed using an emergency support mechanism to bring energy consumption at the monitored site back to normal energy consumption levels.

7. The system according to claim 6, wherein the sensor is deployed at or near a corresponding energy consuming equipment of the monitored site, the sensor being configured to provide equipment specific energy consumption values.

8. The system according to claim 6, wherein the system is configured to monitor the electrical energy consumption of the monitored site and the sensor is deployed at or near a circuit-breaker associated with a corresponding electrical circuit of the monitored site, the sensor being configured to provide circuit-specific energy consumption values.

9. The system according to claim 6, wherein the sensor, the decomposition device and the alerting device are connected to each other via at least one data network.

10. The system according to claim 6, wherein the decomposition device is implemented as a cloud-based network application.

11. The system according to claim 6, wherein the alerting device is implemented as a cloud-based network application.

12. A cloud-based energy consumption alerting platform comprising:
    a data decomposition device comprising a processor and memory storing instructions to execute in the processor, the instructions configured to decompose location-specific energy consumption values according to a defined time period and according to a second characteristic, wherein the instructions configured to decompose according to the second characteristic comprise instructions configured to decompose the values by conducting a seasonal decomposition into trend, seasonal and residual components to identify changes in the energy consumption that are based on seasonal effects and changes that are based on an overall trend, the location-specific energy consumption values being associated with a location of a monitored site and provided to the cloud-based energy consumption alerting platform over at least one data network; and
    an alerting device comprising a processor and memory storing instructions to execute in the processor, the instructions configured to compare a first decomposed energy consumption value of the location-specific energy consumption values, wherein the first decomposed energy consumption value is based on the defined time period and based on the residual component to identify changes in the energy consumption that are based on unintended energy consumption, with a corresponding first reference value based on the decomposed values and to output a message that notifies a user about the unintended energy consumption, if the first decomposed energy consumption value and the determined corresponding first reference value differ from each other, wherein on receiving the message, the unintended energy consumption is configured to be addressed using an emergency support mechanism to bring energy consumption at the monitored site back to normal energy consumption levels.

13. The cloud-based energy consumption alerting platform according to claim 12, further comprising:
    a web-based user interface module configured to notify the user when the first energy consumption value and the determined corresponding first reference value differ from each other.

14. The cloud-based energy consumption alerting platform according to claim 13, wherein the web-based user interface module comprises an interactive website.

15. The cloud-based energy consumption alerting platform according to claim 13, wherein the web-based user interface module comprises an app for a mobile device.

16. The cloud-based energy consumption alerting platform according to claim 13, wherein the web-based user interface module comprises a web service.

17. The cloud-based energy consumption alerting platform according to claim 13, wherein the web-based user interface module comprises an automated messaging service.

* * * * *